United States Patent
Barnowski et al.

(10) Patent No.: US 6,273,666 B1
(45) Date of Patent: Aug. 14, 2001

(54) DEVICE FOR FEEDING ELECTRICAL COMPONENTS TO A MOUNTING MACHINE

(75) Inventors: Frank Barnowski; Mohammad Mehdianpour, both of München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/341,081

(22) PCT Filed: Jan. 13, 1998

(86) PCT No.: PCT/DE98/00112

§ 371 Date: Jul. 2, 1999

§ 102(e) Date: Jul. 2, 1999

(87) PCT Pub. No.: WO98/31207

PCT Pub. Date: Jul. 16, 1998

(30) Foreign Application Priority Data

Jan. 13, 1997 (DE) ............................................. 197 00 840

(51) Int. Cl.[7] .................................................. H05K 13/02
(52) U.S. Cl. ........................... 414/403; 414/422; 414/589; 29/740; 29/832; 269/17
(58) Field of Search ...................... 414/403, 416, 414/401, 584, 396, 422, 425, 589; 242/557; 29/740, 417, 832; 269/17; 156/584

(56) References Cited

U.S. PATENT DOCUMENTS

| | | | |
|---|---|---|---|
| 4,861,220 | * 8/1989 | Smith | 414/401 X |
| 4,934,891 | * 6/1990 | Hawkswell | 414/584 X |
| 5,144,369 | * 9/1992 | Benedict et al. | 414/401 X |
| 5,306,109 | * 4/1994 | Kreuzer et al. | 414/396 X |
| 5,933,942 | * 8/1999 | Kitamura et al. | 29/740 |

FOREIGN PATENT DOCUMENTS

| | | |
|---|---|---|
| 85 25 978 U | 6/1986 | (DE) . |
| 92 16 116 U | 1/1993 | (DE) . |
| 0 277 732 A2 | 10/1988 | (EP) . |
| 2079728A | * 1/1982 | (GB) ................................. 414/401 |

* cited by examiner

Primary Examiner—Frank E. Werner
(74) Attorney, Agent, or Firm—Schiff Hardin & Waite

(57) ABSTRACT

The feed device has its own pneumatic lifting device for raising and lowering a table-like support (2) for feed modules (5), in which the electrical components can be moved into a pick-up position.

As a result, the feed device can be exchanged quickly and easily.

6 Claims, 1 Drawing Sheet

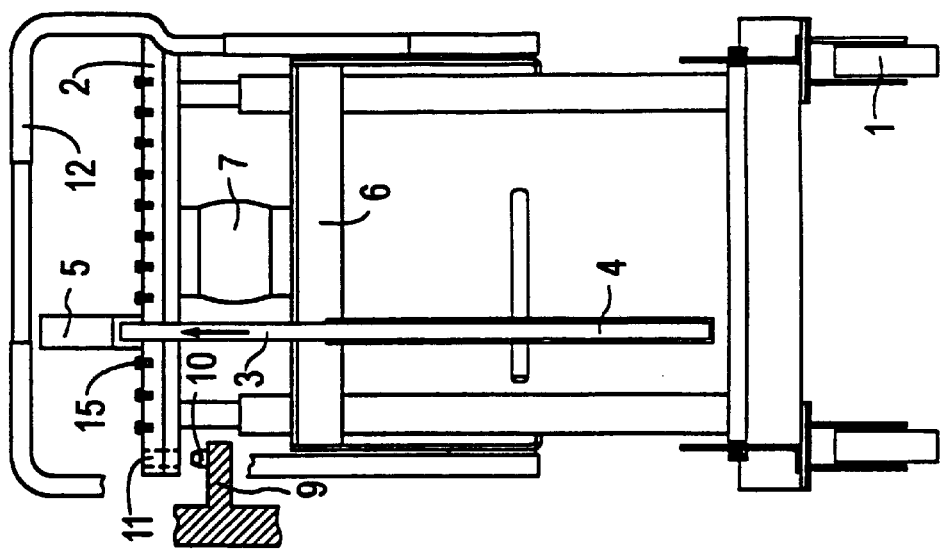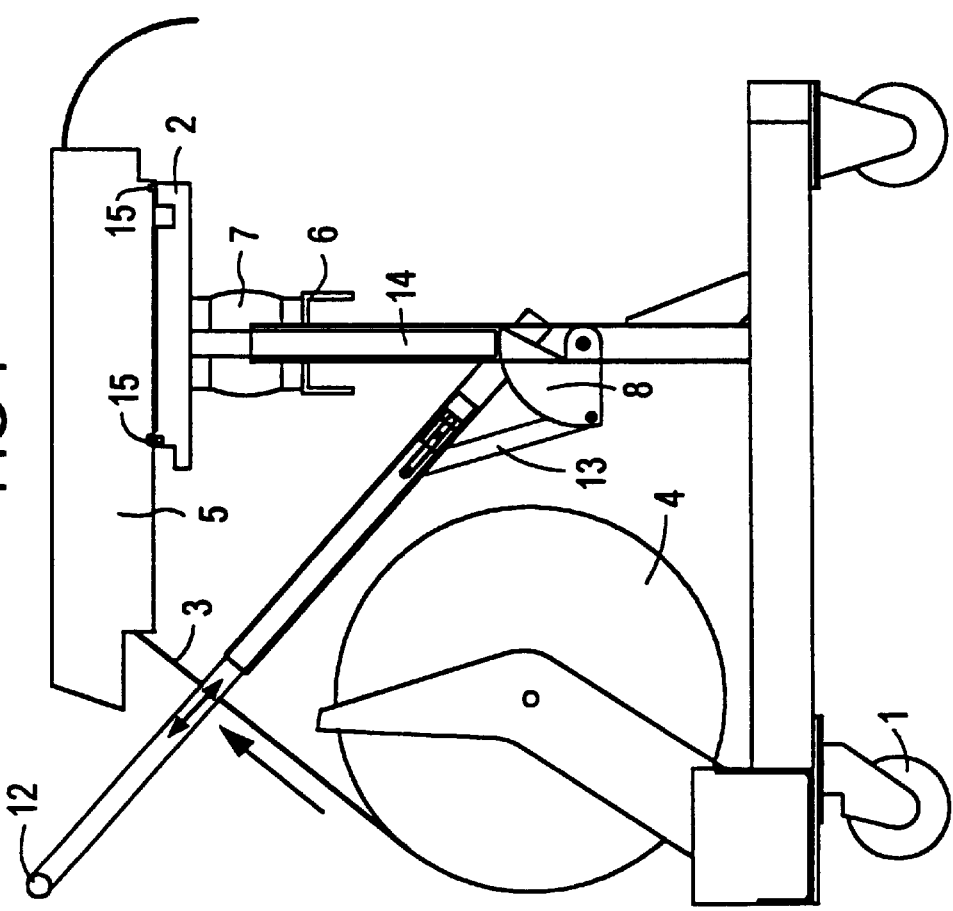

DEVICE FOR FEEDING ELECTRICAL COMPONENTS TO A MOUNTING MACHINE

BACKGROUND OF THE INVENTION

The invention relates to a device for feeding electrical components to a mounting machine for fitting the components to printed circuit boards.

It is usual to hold the components in belts, which are supplied as wound coils. Where necessary, these coils are put together and lined up in rows in a feed device. Each coil is assigned a suitable feed module, into which the component belt is guided. The feed modules are arranged in rows in the same configuration as the coils and are fixed on a table-like support of the feed device. The mounting machine and the support are provided with interacting centering means which allow the feed modules to be correctly assigned to the mounting machine.

Such a configuration with fixed feed modules requires a mounting machine with an x-y-displaceable mounting head, the pick-up gripper of which can be displaced to the individual pick-up positions of the various feed modules. Since it is desirable for the displacement travel of such a mounting head to be as short as possible, the number of feed modules in a feed device is limited, so that the feed device has to be exchanged relatively often detachably linked to the mounting machine. It can therefore be exchanged, together with the coils and the feed modules, in a single operation, so that the changeover times are correspondingly low.

Hitherto, it has been customary to transport the frame-like feed unit by means of a lifting truck. This makes it possible to lower the table-like support onto a holder of the mounting machine from above and to center it accurately using the centering means.

European reference EP 0 277 732 A discloses a carousel-like feed device, the feed modules of which are held on a table-like support which is mounted so that it can pivot about a vertical axis. The feed device can be moved on wheels. On its vertical side, facing the mounting machine, of the feed device, there are centering means which face in the direction of movement and can be inserted horizontally into corresponding mating centering means on the mounting machine. An adjustment device, by means of which the vertical position of the centering means can be set to the height of the mating centering means on the mounting machine by means of an adjustment screw, is arranged between the wheels and a chassis of the feed device. Since the feed device is able to hold a very large number of coils, the feed device does not have to be changed very often, so that the considerable time involved in the height adjustment is of only minor importance.

Furthermore, German reference DE 85 25 978 U (corresponding to U.S. Pat. No. 4,593,462) discloses a feed device which likewise has horizontally oriented centering means. A holding box for the empty bands is mounted tiltably by means of a toggle-lever drive, in order to be able to free an insertion opening for the bands.

SUMMARY OF THE INVENTION

The invention is based on the object of making the feed unit easier to handle.

In general terms the present invention is a feed device for feeding electrical components to a mounting machine for fitting the components to printed circuit boards. The feed device is displaceable on steerable wheels. The feed device has a table-like support for feed modules, by means of which the components can be transported out of component magazines into a pick-up position. It is possible to fix the support in a defined position on a mount of the mounting machine using a centering means, by lowering it vertically. The feed device has its own, rapidly actuable lifting device. The support is guided with lateral clearance in a vertical guide of the feed device.

As a result, it is possible to transport and actuate the feed device independently of other auxiliary means. The lifting device makes it possible to lift the support, together with the feed modules, separately and to move it above upwardly projecting centering pins of the holder of the mounting machine. Then, as a result of the lifting device being lowered, the support is placed onto the holder, with the centering means engaging into one another. This makes it possible to dispense with the cumbersome lifting trucks and to shorten the changeover times.

The vertical guide, which is provided with clearance, makes it possible to position the feed devices on the mounting machine with little accuracy. The floating mounting, which is provided with lateral clearance, of the support makes it possible for the support still to be accurately centered on the mounting machine.

In an advantageous development of the present invention the lifting device is designed as a bellows cylinder which is arranged between the underside of the support and a stationary supporting part of the feed device. The feed device has a compressed-air port, which can be connected to a compressed-air supply of the mounting machine.

The bellows cylinder represents a simple drive element which is easy to actuate and control and by means of which the support, together with the modules, can be raised and lowered in a simple manner. The compressed-air port makes it possible to utilize the compressed-air supply which is in any case present on the mounting machines for the lifting operation. Moreover, the bellows cylinder can inherently be moved sideways and is thus able to absorb an offset between the centering means before lowering without there being any need for articulated mounting of the bellows cylinder.

In a further embodiment the feed device has a locking mechanism for holding the support in an upper lifted position.

The locking mechanism makes it possible to fix the table-like support, together with the modules, in its highest position without the need for any external intervention. In this way, the feed device can be attached to the mounting machine in a position in which it is ready for lowering. In order for it to be lowered, the bellows cylinder is connected to the compressed-air supply of the machine and compressed air is applied. As a result, the table-like support is held in the upper position, so that the locking mechanism, which is now free from load, can be released without problems. A bleed valve then allows the support to be lowered gently onto the holder of the mounting machine, with the centering means engaging into one another.

To change the feed unit, compressed air is again applied to the bellows cylinder and the support is raised into its highest position, in which the locking means can easily be moved into their locked position. The bellows cylinder is then vented and disconnected from the compressed-air supply. The table-like support is then held in its upper position by the locking mechanism. The feed device can then be removed from the mounting machine and replaced in the same way with another feed device which has been prepared.

In another embodiment the feed device is designed as a trolley which can be moved manually and has a sliding handle. The sliding handle is mounted telescopically on the feed device and actuates at least one locking catch of the locking mechanism.

These refinements make the device easy to handle, and in particular the locking mechanism is easy to actuate by means of the sliding handle.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 shows a side view of a feed device for feeding electrical components to a mounting machine, FIG. 2 shows a different side view of the device in accordance with FIG. 1.

DESCRIPTION OF THE PREFERRED EMBODIMENTS

In accordance with FIGS. 1 and 2, a feed device for feeding electrical components to a mounting machine is designed as a portable trolley and is provided with wheels 1 which form a steerable undercarriage. A table-like support 2 is held on a frame of the feed device, which is provided with a telescopic lifting device for the support 2. The electrical components are held as magazines in belts 3, which are held ready as coils 4 which can be arranged in rows. On the table-like support 2, feed modules 5 can be attached next to one another, in the same configuration as the coils 4, to holding and centering elements 15. The belts 3 are guided through the feed modules 5, in which the components are uncovered and held ready for removal by a gripper of the mounting machine.

A bellows cylinder 7, which makes it possible to raise and lower the support 2 by means of compressed air, is arranged between the table-like support 2 and a fixed supporting part 6 of the feed device. The bellows is guided, with lateral play, in a telescopic, vertical guide 14 of the feed device. The support 2 is shown here in a top lifted position, which is secured by means of a locking catch 8 of a locking device. The support 2 is situated above a holder 9 of the mounting machine. The support and the holder 9 are provided with interacting centering pins 10 and centering holes 11 which, when the support 2 is lowered onto the holder 9, engage into one another without any play, thus ensuring that the feed modules 5 are accurately aligned with respect to the mounting machine.

A sliding handle 12 for moving the feed device is mounted displaceably on the frame of the feed device and, by means of a push rod 13, is able to actuate the pivotable locking catch 8.

The bellow cylinder 7 can be temporarily connected to the compressed-air supply of the mounting machine via a compressed-air port and can be actuated by means of a control valve. It allows the support 2 to be raised and lowered with little difficulty. The bellows cylinder has the advantage that it allows lateral deviation in all directions without the need for an articulated mounting. As a result, the support 2 is easy to center on the holder 9 when it is lowered onto the latter without the feed device having to be accurately aligned with respect to the mounting machine.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A trolley-like device for feeding electrical components to a mounting machine for fitting the components onto a printed circuit board, said trolley-like device comprising:

a frame having steerable wheels to provide displacement of the device and a vertical guide;

a table-like support for feed modules, by which the components are transportable out of component magazines mounted on the frame into a pick-up position;

the support being guided on said frame for vertical movement with lateral clearance in the vertical guide;

a pneumatically actable lifting device with lateral movement engaging the support to move the support relative to the frame; and the support and a mount of the mounting machine having a centering apparatus so that the support can be lowered onto the mount in a defined position using the centering apparatus.

2. The feed device as claimed in claim 1, wherein the lifting device is a bellows cylinder which is arranged between an underside of the support and a stationary support of the frame, and wherein the feed device further comprises a compressed-air port, which is connectable to a compressed-air supply of the mounting machine.

3. The feed device as claimed in claim 1, wherein the frame of the feed device has a locking mechanism for holding the support in an upper lifted position.

4. The feed device as claimed in claim 3, wherein the feed device is manually movable and the frame has a sliding handle.

5. The feed device as claimed in claim 4, wherein the sliding handle is mounted telescopically on the feed device and actuates at least one locking catch of the locking mechanism.

6. A feed device as claimed in claim 1, wherein the feed device is manually movable and the frame has a sliding handle.

* * * * *